(12) United States Patent
Yoon et al.

(10) Patent No.: US 8,058,169 B2
(45) Date of Patent: Nov. 15, 2011

(54) INTERCONNECTION ARCHITECTURE FOR SEMICONDUCTOR DEVICE

(75) Inventors: Jaeman Yoon, Seoul (KR); Yungi Kim, Gyeonggi-do (KR); Kangyoon Lee, Gyeonggi-do (KR); Youngwoong Son, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1049 days.

(21) Appl. No.: 11/764,660

(22) Filed: Jun. 18, 2007

(65) Prior Publication Data

US 2008/0017997 A1 Jan. 24, 2008

(30) Foreign Application Priority Data

Jul. 21, 2006 (KR) .................. 10-2006-0068418

(51) Int. Cl.
*H01L 21/31* (2006.01)

(52) U.S. Cl. ........ 438/671; 438/763; 438/942; 257/786; 257/E21.476

(58) Field of Classification Search .................. 438/671, 438/763, 942; 257/786, E23.141, E21.476
See application file for complete search history.

(56) References Cited

U.S. PATENT DOCUMENTS

| | | | |
|---|---|---|---|
| 6,638,441 B2 | 10/2003 | Chang et al. | |
| 7,151,040 B2* | 12/2006 | Tran et al. | 438/401 |
| 7,413,981 B2* | 8/2008 | Tang et al. | 438/669 |
| 7,611,944 B2* | 11/2009 | Tran et al. | 438/241 |
| 7,666,578 B2* | 2/2010 | Fischer et al. | 430/314 |
| 2002/0081502 A1* | 6/2002 | Hayano et al. | 430/5 |
| 2006/0046484 A1 | 3/2006 | Abatchev et al. | |
| 2006/0211260 A1* | 9/2006 | Tran et al. | 438/763 |
| 2006/0216922 A1* | 9/2006 | Tran et al. | 438/618 |
| 2006/0216923 A1* | 9/2006 | Tran et al. | 438/622 |

* cited by examiner

*Primary Examiner* — Thinh Nguyen
(74) *Attorney, Agent, or Firm* — Harness, Dickey & Pierce, PLC

(57) ABSTRACT

An interconnection architecture, for a semiconductor device (having regions arranged to include at least an inner region, an intermediate region located at least aside the inner region, and an outer region located at least on a side of the intermediate region opposite to the inner region, includes: one or more pairs of first and second signal lines, each pair extending from the inner region into the intermediate region; first portions and second portions of the first and second signal lines being parallel, respectively, the first portions being located in the inner region; the first and second portion of at least the first signal line not being collinear; and an intra-pair line-spacing, d(i), for each pair including the following magnitudes, d2 in the inner region, and d2' in the intermediate region, where d2<d2'.

3 Claims, 22 Drawing Sheets

INTERCONNECTION ARCHITECTURE FOR SEMICONDUCTOR DEVICE

PRIORITY STATEMENT

The present patent application claims priority under 35 U.S.C. §119 upon Korean Patent Application No. 2006-0068418, filed on Jul. 21, 2006, in the Korean Patent Office, the entire contents of which is incorporated herein in its entirety by reference.

BACKGROUND

In the art of integrated circuit structures, in general, a reduction in the footprint of a given circuit is generally considered to represent an improvement in the circuit. In some circumstances, a reduced footprint for the given circuit is achieved by using the same functional components albeit reduced in size and (possibly) altered in shape. Hence, irrespective of the particular nature of a given circuit, a seemingly perennial design goal vis-à-vis the given circuit is to reduce its footprint.

In the art of manufacturing, there is the concept of tolerance. For a given dimension of a structure in an integrated circuit, manufacturing tolerance should be understood as a permissible amount of deviation manifested by an instance of the structure relative to a specified value for the given dimension. Occasionally, the goal of reducing footprint size is frustrated by the realities of manufacturing tolerances.

SUMMARY

An embodiment of the present invention provides an interconnection architecture for a semiconductor device having regions arranged to include at least an inner region, an intermediate region located at least aside the inner region, and an outer region located at least on a side of the intermediate region opposite to the inner region, the interconnection architecture comprising: one or more pairs of first and second signal lines, each pair extending from the inner region into the intermediate region; first portions and second portions of the first and second signal lines being parallel, respectively, the first portions being located in the inner region; the first and second portion of at least the first signal line not being collinear; and an intra-pair line-spacing, d(i), for each pair including the following magnitudes, d2 in the inner region, and d2' in the intermediate region, where d2<d2'.

An embodiment of the present invention provides an interconnection architecture for a semiconductor memory device arranged to include a inner region having a plurality of memory cells, an intermediate region located at least aside the inner region, and a outer region located at least on a side of the intermediate region opposite to the inner region, the interconnection architecture comprising: one or more pairs of parallel signal lines; an intra-pair line-spacing for each pair including the following magnitudes, d2 in the inner region, and d2' in the intermediate region, where d2<d2'; an inter-pair line-spacing for each pair including the following magnitudes, d1 in the inner region, and d1' in the intermediate region, where d1'<d1; and a first repeating pattern, in the inner region, includes two adjacent pairs of parallel lines and has the intra-pair line-spacing d2 and the inter-pair line-spacing d1, where d2<d1; at least three line pairs exhibiting the first repeating pattern; a second repeating pattern, in the intermediate region, includes two adjacent pairs of parallel lines and has the intra-pair line-spacing d2' and the inter-pair line-spacing d1'; and at least three line pairs exhibiting the second repeating pattern.

An embodiment of the present invention provides a method of forming a semiconductor memory device arranged to include a inner region having a plurality of memory cells, an intermediate region located at least aside the inner region, and a outer region located at least on a side of the intermediate region opposite to the inner region, the method comprising: providing a substrate; forming an insulating layer on the substrate, a conductive layer on the insulating layer and a sacrificial layer on the conductive layer; forming a photoresist on the sacrificial layer; patterning the photoresist to include one or more rectangular openings; sizing each opening to be of width LC in the inner region; and sizing each opening to be of width LIR in the intermediate region, where LC<LIR.

An embodiment of the present invention provides a method of forming a semiconductor memory device arranged to include a inner region having a plurality of memory cells, an intermediate region located at least aside the inner region, and a outer region located at least on a side of the intermediate region opposite to the inner region, the method comprising: providing a substrate; forming an insulating layer on the substrate and a first mold layer on the insulating layer; forming a photoresist on the first mold layer; patterning the photoresist to include one or more rectangular openings; sizing each opening to be of width LC in the inner region; and sizing each opening to be of width LIR in the intermediate region, where LC<LIR.

Additional features and advantages of the present invention will be more fully apparent from the following detailed description of example embodiments, the accompanying drawings and the associated claims.

Figure 1:
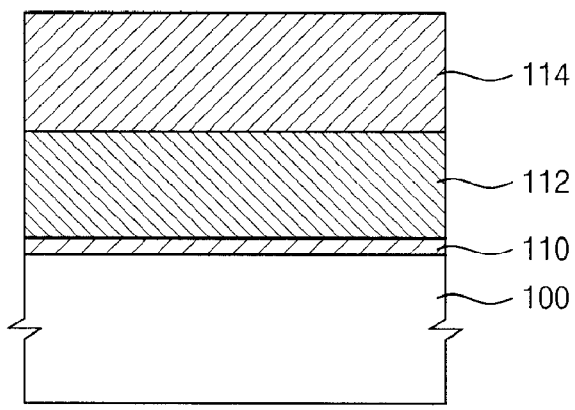
FIGS. 1, 2b-2c, 3a-3b, 4b-4c, 7b-7c and 8b-8c are cross-sectional views

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

A semiconductor device can be described as having an interconnection architecture, which itself can be described as having an inner region surrounded by an intermediate region, with the intermediate region being surrounded by a peripheral region; see FIG. 18 (discussed in detail below). For example, where the integrated circuit is a memory device: memory cells and their related read/write circuitry, etc., are located in the inner (or "cell") region; the outer region corresponds to a peripheral region where peripheral circuitry (e.g., bias circuits, clock generators, control circuits, data output circuits, data output circuits, etc.) can be found; and the intermediate region corresponds to an interface region in which signal lines from the memory cell region are connected to signal lines from the peripheral region.

Figure 18:
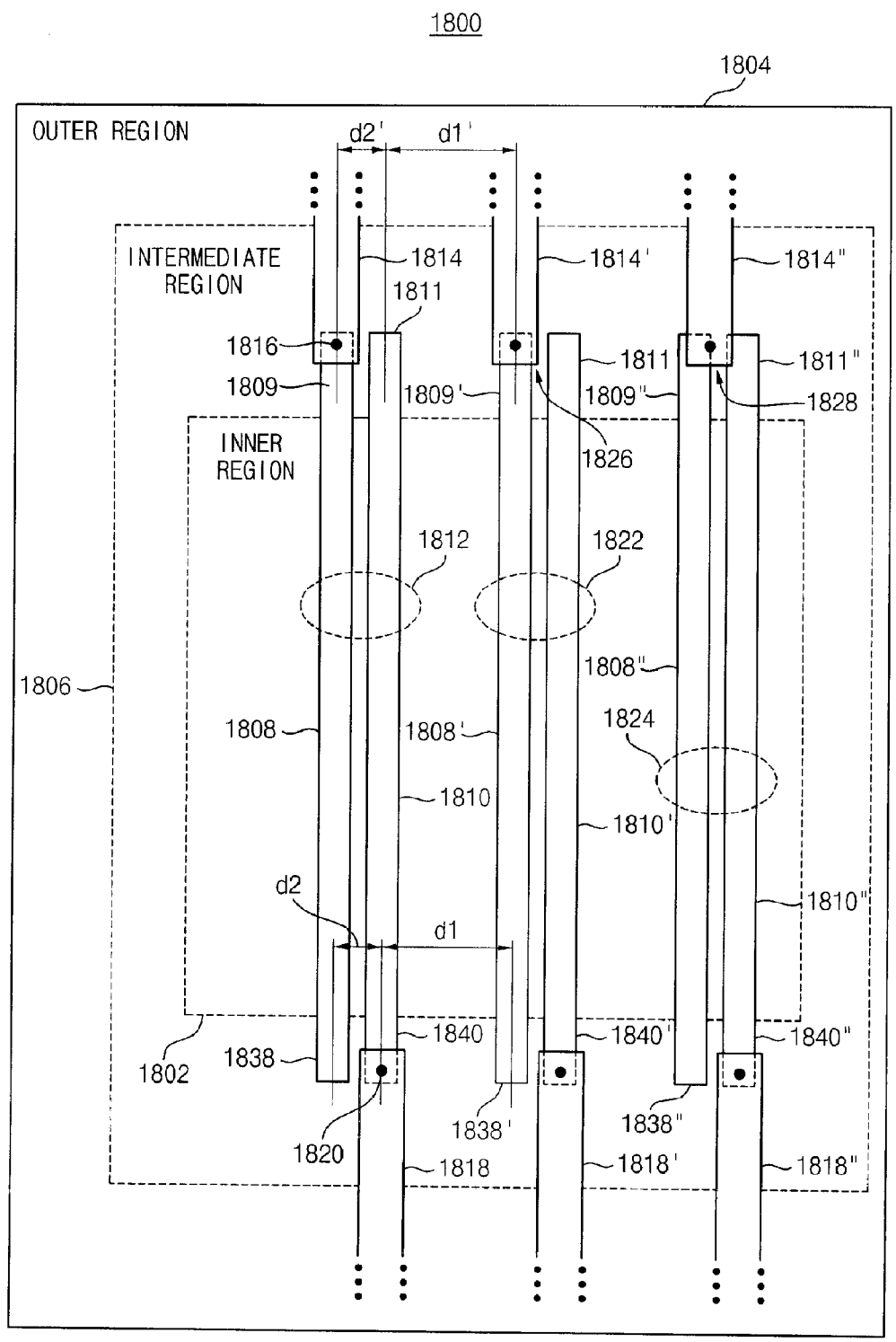
FIG. 18 is a top view of wiring lines for an interconnection architecture of a semiconductor device, wherein FIG. 18 reflects circumstances recognized by the inventor in developing at least some of the embodiments of the present invention.

FIG. 18 is a top view of wiring lines for an interconnection architecture of a semiconductor device, wherein FIG. 18 reflects circumstances recognized by the inventor in developing at least some of the embodiments of the present invention.

In FIG. 18, a semiconductor device 1800 (e.g., a memory device) includes an inner region 1802, an intermediate region 1806 and an outer region 1804. Inner region 1802 includes pairs 1812, 1822 and 1824 of signal lines 1808 & 1810, 1808' & 1810' and 1808" & 1810", respectively. An inter-pair spacing (or, in other words, pitch) between signal lines in inner region 1802 is denoted as d1. An intra-pair spacing (or, again, pitch) between signal lines in inner region 1802 is denoted as d2. Typically, d2<d1.

For simplicity, FIG. 18 depicts only signal line pairs 1812, 1822 and 1824. It should be understood that a typical instance of semiconductor device 1800 would have many more signal line pairs.

Signal line pairs 1812, 1822 and 1824, specifically, corresponding portions 1809 & 1811, 1838 & 1840, 1809' & 1811', 1838' & 1840', 1809" & 1811" and 1838" & 1840", respectively, extend outside of inner region 1802 into intermediate region 1806. Signal lines 1814, 1814', 1814", 1818, 1818' and 1818" originate in outer region 1804 and extend into intermediate region 1806 so as to overlap with portions 1809, 1809', 1809", 1840, 1840' and 1840", respectively, with electrical connections therebetween being facilitated by vias 1816 and 1820, respectively. An intra-pair spacing (or, again, pitch) between signal lines in intermediate region 1806 is denoted as d2'. An inter-pair spacing (or, again, pitch) between signal lines in intermediate region 1806 is denoted as d1'.

In developing one or more embodiments of the present invention, the inventor recognized at least the following (as described in terms of FIG. 18): in the circumstances of portion 1809 and line 1814, alignment is good; in the circumstances of portion 1809' and line 1814', alignment is distorted (as called out by arrow 1826) due to manufacturing tolerances, but no unintended electrical connection has resulted; and in the circumstances of portion 1809" and line 1814", alignment is yet more distorted due (again) to manufacturing tolerances, with there being an unintended overlap 1828 between line 1814" and portion 1811", resulting in an unwanted electrical connection therebetween. At least one embodiment of the present invention avoids such tolerance-induced overlaps by providing an interconnection architecture having alternate signal line configurations in intermediate region 1806.

Figure 19A:
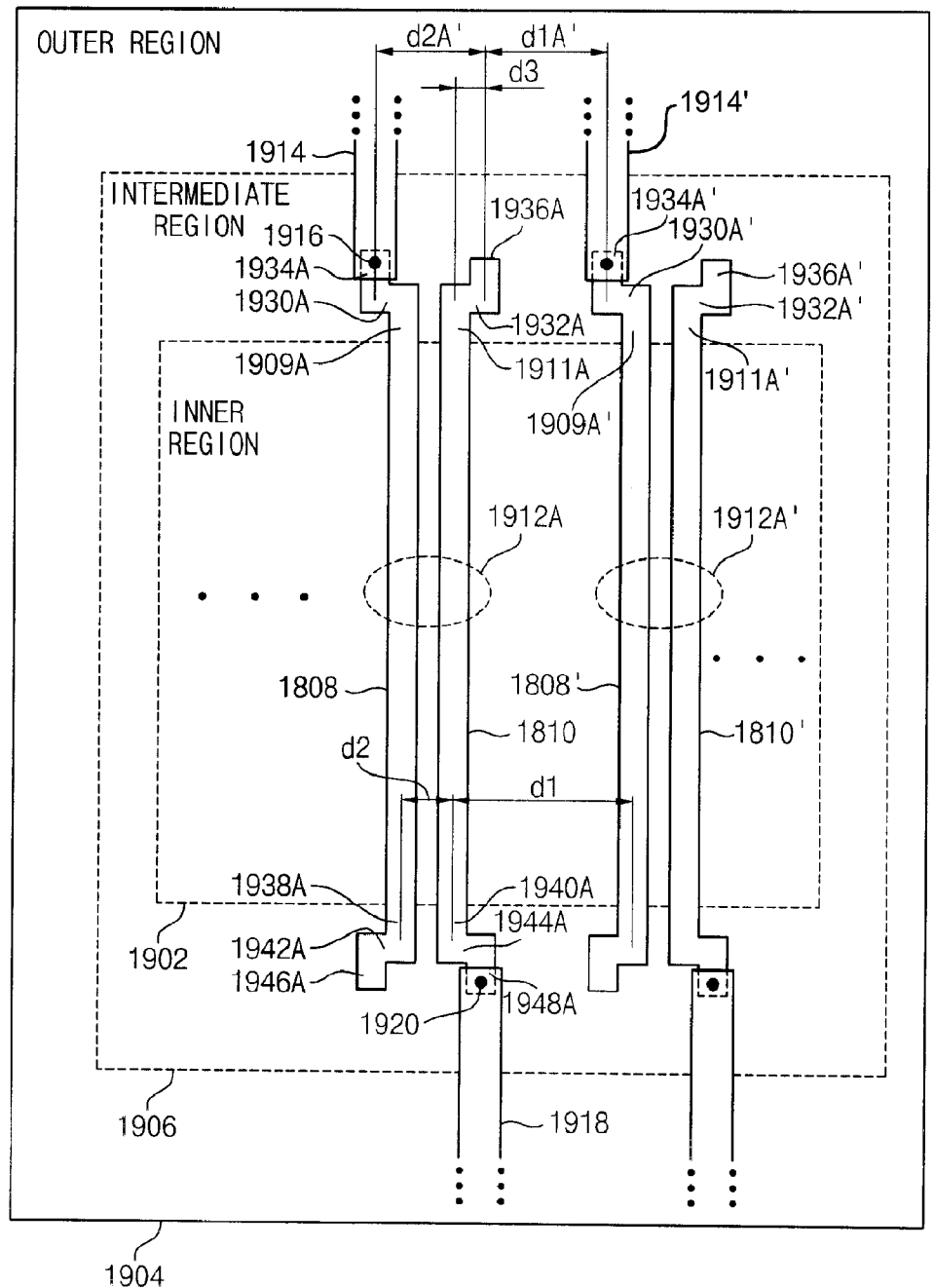
FIG. 19A is a top view of wiring lines for an interconnection architecture of a semiconductor device, according to an example embodiment of the present invention.

FIG. 19A is a top view of wiring lines for an interconnection architecture of a semiconductor device, according to an example embodiment of the present invention.

In FIG. 19A, a semiconductor device 1900A (e.g., a memory device) includes an inner region 1902, an intermediate region 1904 and an outer region 1904 as well as pairs 1912A and 1912A' of signal lines. Within inner region 1902, pairs 1912A and 1912A' include signal lines 1808 & 1810 and 1808' & 1810', respectively. An inter-pair spacing (or, in other words, pitch) in intermediate region 1904 is denoted (again) as d1. An intra-pair spacing (or, again, pitch) in intermediate region 1904 is denoted (again) as d2. Typically, d2<d1.

For simplicity, FIG. 19A depicts only signal line pairs 1912A and 1912A'. It should be understood that a typical instance of semiconductor device 1900A would have many more signal line pairs. More particularly, pairs 1912A and 1912A' represent a pattern that would be repeated multiple times.

Signal line pairs 1912A and 1912A', specifically, corresponding portions 1909A & 1911A, 1930A & 1932A, 1934A & 1936A, 1938A & 1940A, 1942A & 1944A and 1946A & 1948A, etc., respectively, extend outside of inner region 1902 into intermediate region 1904. Signal lines 1914, 1914', 1918, etc., originate in outer region 1904 and extend into intermediate region 1904 so as to overlap with portions 1934A, 1934A', 1948A, etc., respectively, with electrical connections therebetween being facilitated by vias 1916 and 1920, respectively. An intra-pair spacing (or, again, pitch) between signal line pairs in intermediate region 1904 is denoted as d2A'. An inter-pair spacing (or, again, pitch) between signal lines in intermediate region 1906 is denoted as d1A'.

Inspection of FIG. 19A reveals that intra-pair spacing d2A' in intermediate region 1906 is greater than intra-pair spacing d2 in inner region 1902, i.e., d2<d2A'. This is because portions 1934A & 1936A, 1946A & 1948A, etc., are laterally displaced outwardly relative to portions 1909A & 1911A, 1938A & 1940A, etc., respectively. Such displacement is denoted as d3. Typically, d3<d2A'. Typically, d3<d2.

Stated differently, portions 1934A & 1934A' can be described as not being collinear with regard to portions 1808 & 1808', respectively. Similarly, portions 1946A etc., are not collinear with regard to portions 1808 & 1808', respectively. Also, portions 1936A & 1936A' are not collinear with regard to portions 1810 & 1810', respectively, and portions 1948A, etc., are not collinear with regard to portions 1810 & 1810', respectively.

While FIG. 19A depicts that d3 for the left member of pair 1912A is the same magnitude as d3 for the right member of pair 1912A, such instances of d3 can be different. Similarly, though depicted as being the same, d3 for pair 1912A can differ from d3 for pair 1912A'.

Pairs 1912A and 1912A' are symmetric. More particularly, in terms of pair 1912A (for example) the signal line including portions 1934A, 1930A, 1909A, 1808, 1938A, 1942A and 1946A is mirror symmetric with respect to the signal line including portions 1936A, 1932A, 1911A, 1810, 1940A, 1944A and 1948A. Also, in terms of pair 1912A (for example), the upper half of the pair including corresponding portions 1909A & 1911A, 1930A & 1932A and 1934A & 1936A is mirror symmetric with respect to the lower half of the pair including corresponding portions 1938A & 1940A, 1942A & 1944A and 1946A & 1948A.

As a more detailed example of an interconnection architecture of a semiconductor device, e.g., such as the interconnection architecture 1900A of FIG. 19A, portions of the signal lines can be described as features. Sizes of such features can be described in terms of a unit feature size, F. In the more detailed example, at least one of the following conditions is true: the intra-pair line-spacing d2 in the inner region is 0.5F, namely d2=0.5F; a line width wC of each pair in the inner region is 0.5F, namely wC=0.5F; a line width wIR of each pair in the intermediate region is 0.5F, namely wIR=0.5F; the inter-pair line-spacing d1 in the inner region is 1.5F, namely d1=1.5F, and the inter-pair line-spacing d1A' in the intermediate region is F, namely d1'=F. As further examples, d2 & d1 and d2 & d1A' can relate as follows, 3(d2)=d1 and 2(d2)=d1A', respectively.

Figure 19B:
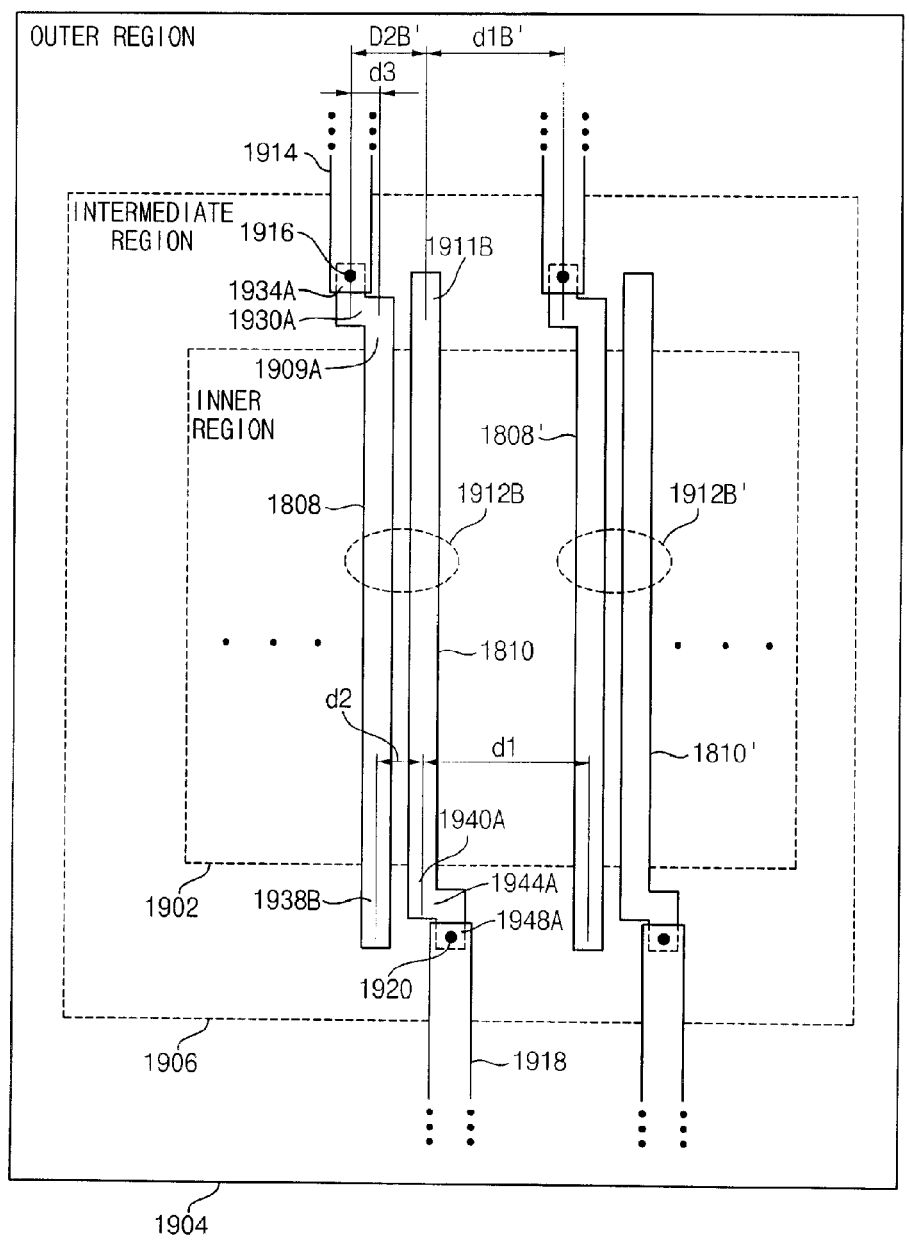
FIG. 19B is a top view of wiring lines for an interconnection architecture of a semiconductor device (e.g., a memory device), according to an example embodiment of the present invention.

FIG. 19B is a top view of wiring lines for an interconnection architecture of a semiconductor device (e.g., a memory device), according to an example embodiment of the present invention.

FIG. 19B is similar to FIG. 19A. In the interests of brevity, like aspects will be described in less detail (if at all). For simplicity, FIG. 19B depicts only signal line pairs 1912B and 1912B'. It should be understood that a typical instance of semiconductor device 1900B would have many more signal line pairs. More particularly, pairs 1912B and 1912B' represent a pattern that would be repeated multiple times.

Signal line pairs 1912B and 1912B', specifically, portions 1909A, 1911B, 1930A, 1934A, 1938B, 1940A, 1944A and 1948A, etc., respectively, extend outside of inner region 1902 into intermediate region 1904. Signal lines 1914, 1918, etc., originate in outer region 1904 and extend into intermediate region 1904 so as to overlap with portions 1934A, 1948A, etc., with electrical connections therebetween being facilitated by vias 1916 and 1920, respectively. An intra-pair spacing (or, again, pitch) between signal lines in intermediate region 1904 is denoted as d2B'. An inter-pair spacing (or, again, pitch) between signal lines in intermediate region 1906 is denoted as d1B'.

Inspection of FIG. 19B reveals that intra-pair spacing d2B' in intermediate region 1906 is greater than intra-pair spacing d2 in inner region 1902, i.e., d2<d2B'. This is because portions 1934A, etc., are laterally displaced relative to portions 1909A, etc., respectively. Again, such displacement is denoted as d3. Typically, d3<d2B'. Typically, d3<d2. While FIG. 19B depicts that d3 for pair 1912B is the same magnitude as d3 for pair 1912B, d3 for pair 1912A can differ from d3 for pair 1912B'.

Stated differently, portions 1934A, etc., can be described as not being collinear with regard to portions 1808, etc., respectively. Also, portions 1948A, etc., are not collinear with regard to portions 1810, etc., respectively. However, portions 1938B, etc., can be described as collinear with regard to portions 1808 & 1808', and portions 1911B, etc., are collinear with regard to portions 1810 & 1810', respectively.

Pairs 1912B and 1912B' are asymmetric. More particularly, in terms of pair 1912B (for example), the signal line including portions 1934A, 1930A, 1909A, 1808 and 1938B is not mirror symmetric with respect to the signal line including portions 1911B, 1810, 1940A, 1944A and 1948A. Also, in terms of pair 1912B (for example), the upper half of the pair including portions 1909A, 1911B, 1930A and 1934A is not mirror symmetric with respect to the lower half of the pair including portions 1938B, 1940A, 1944A and 1948A.

Figure 19C:
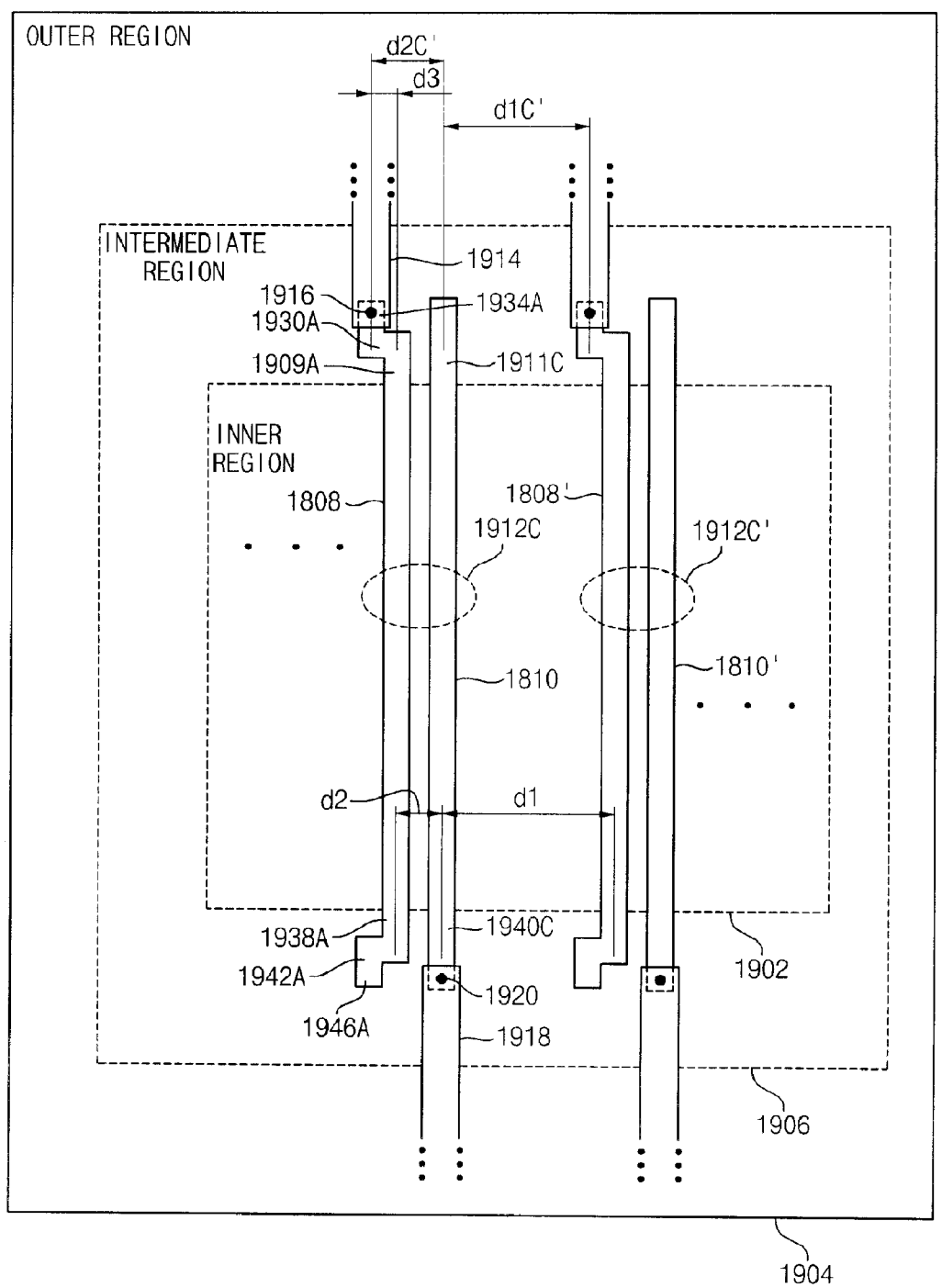
FIG. 19C is a top view of wiring lines for an interconnection architecture of a semiconductor device (e.g., a memory device), according to an example embodiment of the present invention.

FIG. 19C is a top view of wiring lines for an interconnection architecture of a semiconductor device (e.g., a memory device), according to an example embodiment of the present invention.

FIG. 19C is similar to FIGS. 19A and 19B. In the interests of brevity, like aspects will be described in less detail (if at all). For simplicity, FIG. 19C depicts only signal line pairs 1912C and 1912C'. It should be understood that a typical instance of semiconductor device 1900C would have many more signal line pairs. More particularly, pairs 1912C and 1912C' represent a pattern that would be repeated multiple times.

Signal line pairs 1912C and 1912C', specifically, portions 1909A, 1911C, 1930A, 1934A, 1938A, 1940C, 1942A, 1946A, etc., respectively, extend outside of inner region 1902 into intermediate region 1904. Signal lines 1914, 1918, etc., originate in outer region 1904 and extend into intermediate region 1904 so as to overlap with portions 1934A, 1940C, etc., respectively, with electrical connections therebetween being facilitated by vias 1916 and 1920, respectively. An intra-pair spacing (or, again, pitch) between signal lines in intermediate region 1904 is denoted as d2C'. An inter-pair spacing (or, again, pitch) between signal lines in intermediate region 1906 is denoted as d1C'.

Inspection of FIG. 19C reveals that intra-pair spacing d2C' in intermediate region 1906 is greater than intra-pair spacing d2 in inner region 1902, i.e., d2<d2C'. This is because portions 1934A, etc., are laterally displaced relative to portions 1808, etc., respectively. Again, such displacement is denoted as d3. Typically, d3<d2C'. Typically, d3<d2. While FIG. 19A depicts that d3 for pair 1912A is the same magnitude as d3 for pair 1912C, d3 for pair 1912A can differ from d3 for pair 1912C'.

Stated differently, portions 1934A, etc., can be described as not being collinear with regard to portions 1808 & 1808', respectively. Also, portions 1946A, etc., are not collinear with regard to portions 1808 & 1808', respectively. However, portions 1911C, etc., can be described as collinear with regard to portions 1810 & 1810', and portions 1940C, etc., are collinear with regard to portions 1810 & 1810', respectively.

Pairs 1912C and 1912C' are asymmetric. More particularly, in terms of pair 1912C (for example), the signal line including portions 1934A, 1930A, 1909A, 1808, 1938A, 1942A and 1946A is not mirror symmetric with respect to the signal line including portions 1911C, 1810 and 1940C. However, in terms of pair 1912C (for example), the upper half of the pair including portions 1909A, 1911C, 1930A and 1934A is mirror symmetric with respect to the lower half of the pair including portions 1938A, 1940C, 1942A and 1946A.

As a further alternative, a semiconductor device (not depicted) could include other combinations of signal line pairs, e.g., pairs 1912A & 1912B, 1912A & 1912C, 1912B & 1912C, as well as pairs 1912A & 1912B & 1912C.

Now, a discussion is provided of a method (according to an example embodiment of the present invention) for manufacturing an interconnection architecture of a semiconductor device, e.g., such as the interconnection architecture 1900A of FIG. 19A. The example method will be illustrated via reference to FIGS. 1-8c. In particular, FIGS. 1, 2b-2c, 3a-3b, 4b-4c, 7b-7c and 8b-8c are cross-sectional views and FIGS. 2a, 4a, 5-6, 7a and 8a are top views of various intermediary stages in the example method.

Figure 2A:
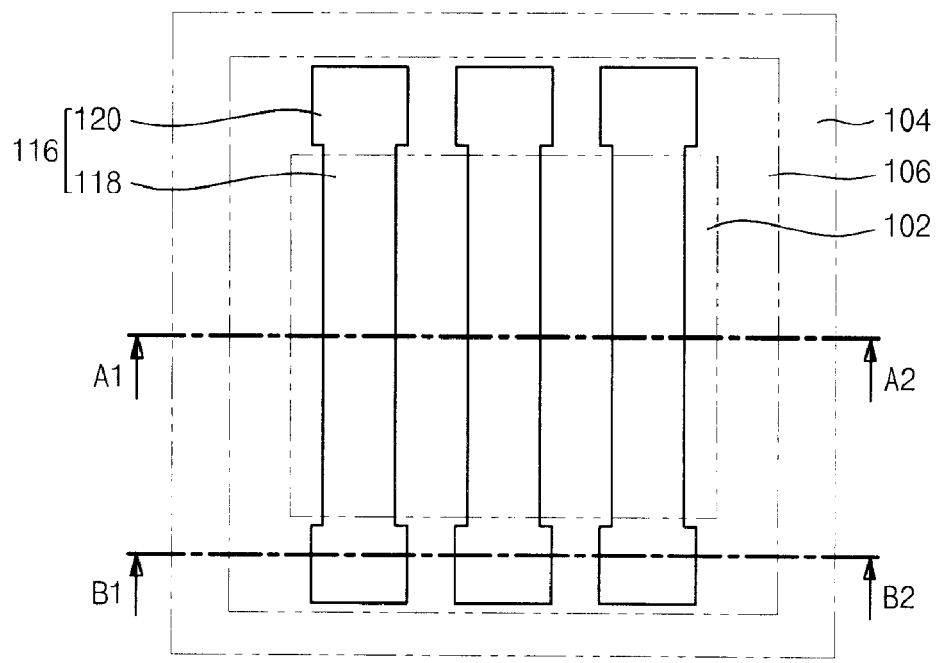
FIGS. 2a, 4a, 5-6, 7a and 8a are top views of various intermediary stages in a method (according to an example embodiment of the present invention) for manufacturing an interconnection architecture of a semiconductor device.
Figure 2B:
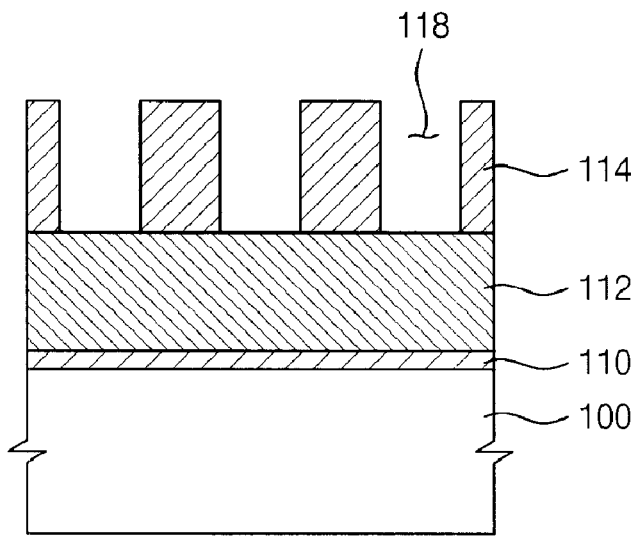
Figure 2C:
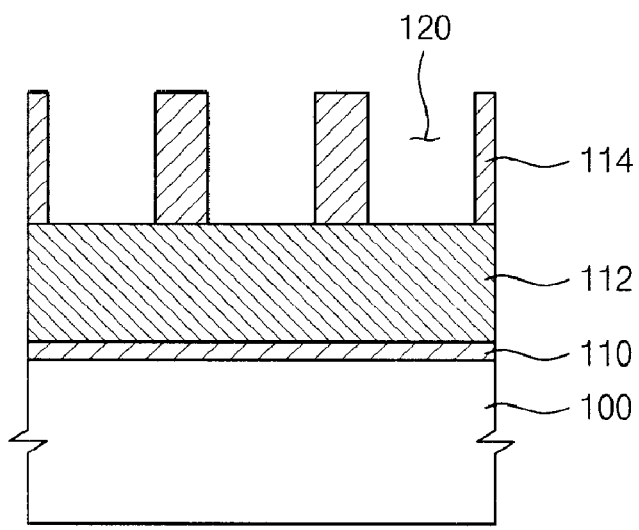

In FIG. 1, a substrate 100 (e.g., single crystal silicon) is provided, on which are formed an insulating layer 110, and thereon a conductive layer 112, and thereon a sacrificial layer 114. FIGS. 2a-2c depict an intermediate stage in which sacrificial layer 114 has been patterned and partially removed.

In FIG. 2a, for continuity vis-à-vis, e.g., FIG. 19a, an inner region 102, an intermediate region 106 and an outer region 104 have been depicted. Openings 116 have been formed in sacrificial layer 114 as a result of the patterning thereof. Each opening 116 can be described as having a shape similar to the uppercase letter "I" and also can be described as including body opening 118, and head & foot openings 120.

FIG. 2b is a cross-section of the intermediate stage of FIG. 2a taken along the line A1:A2 so as to depict inner region 102. FIG. 2c is a cross-section of the intermediate stage of FIG. 2a taken along the line B1:B2 so as to depict intermediate area 106. Opening 120, which can be described as having a width $L_{IR}$, is wider than opening 118, which can be described as having a width $L_C$.

Figure 3A:
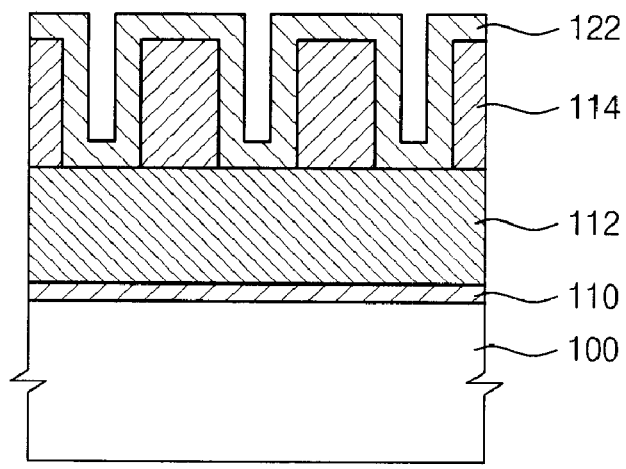
Figure 3B:
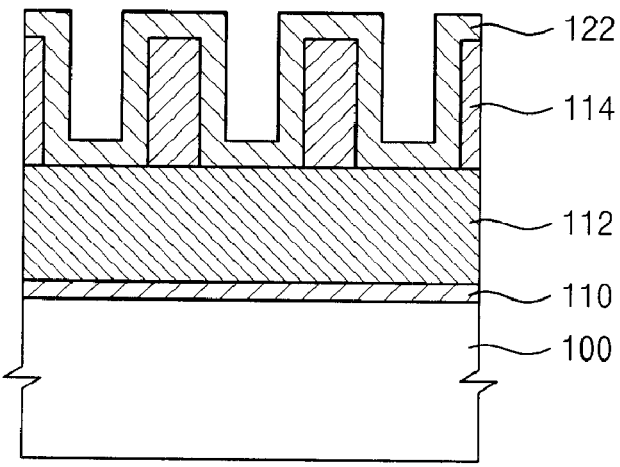

FIGS. 3a-3b depict an intermediate stage formed subsequently to that of FIGS. 2b-2c. In FIGS. 3a-3b, a mask layer 122 (e.g., a dielectric such as an oxide of silicon or silicon nitride) has been formed on the remaining portions of sacrificial layer 114, and on portions of conductive layer 112 exposed by openings 118 and 120. The material for mask layer 122 can, e.g., have a high etch selectively relative to sacrificial layer 114. For example, if sacrificial layer 114 is an oxide, then mask layer 122 can be silicon nitride.

Figure 4A:
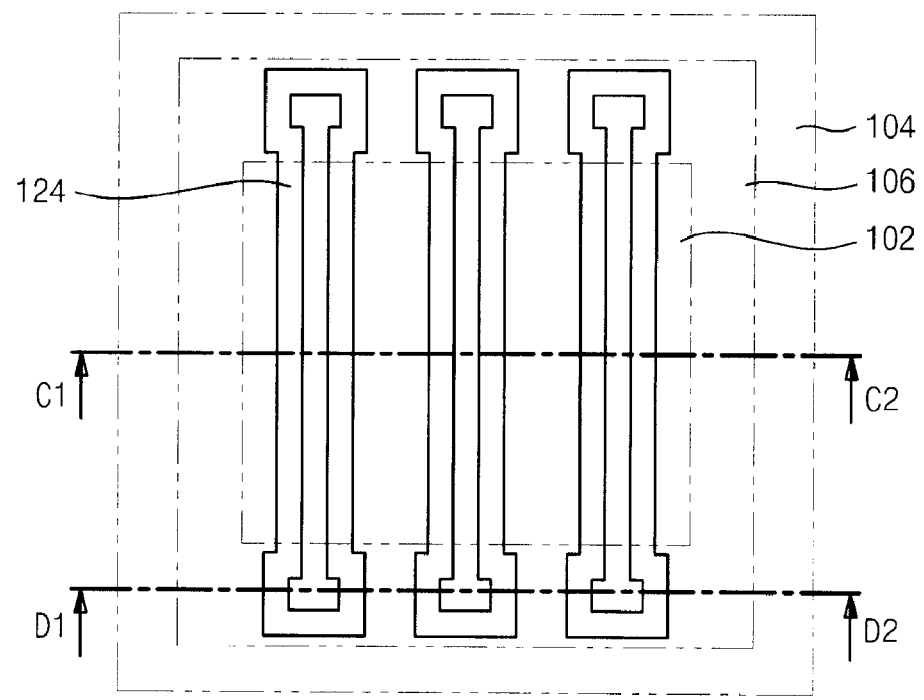
Figure 4B:
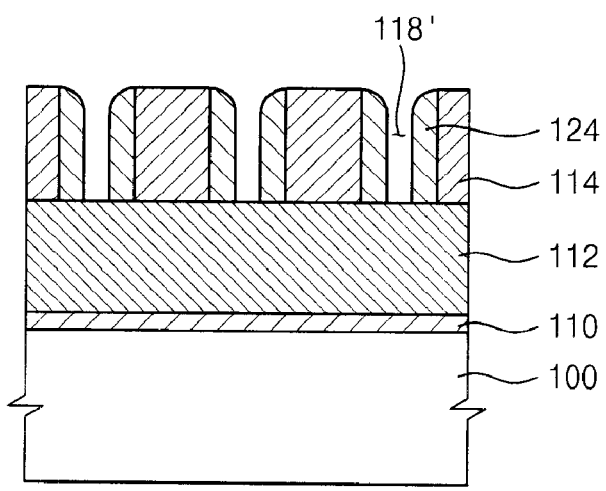
Figure 4C:
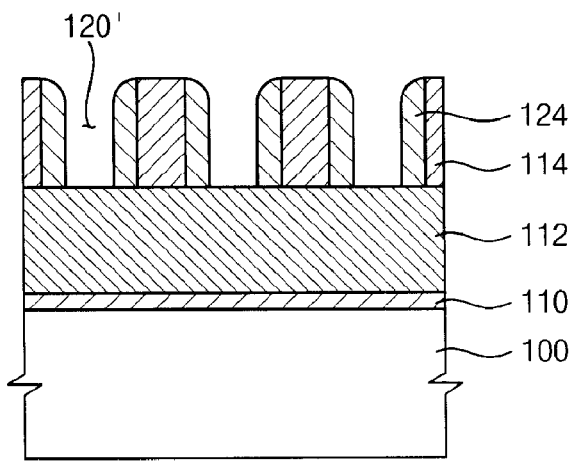

FIGS. 4a-4c depict an intermediate stage, subsequent to that of FIGS. 3a-3b, in which mask layer 122 has been selectively removed (e.g., anisotropically etched, e.g., use a dry etch technique) resulting in openings 118' and 120'. FIG. 4b is a cross-section of the intermediate stage of FIG. 4a taken along the line C1:C2 so as to depict inner region 102. FIG. 2c is a cross-section of the intermediate stage of FIG. 2a taken along the line D1:C2 so as to depict intermediate area 106. The selective removal of mask layer 122 exposes portions of conductive layer 112. Remaining portions 124 of mask layer 122 remain as spacers abutting sidewalls of the remaining portions of sacrificial layer 114.

Figure 5:
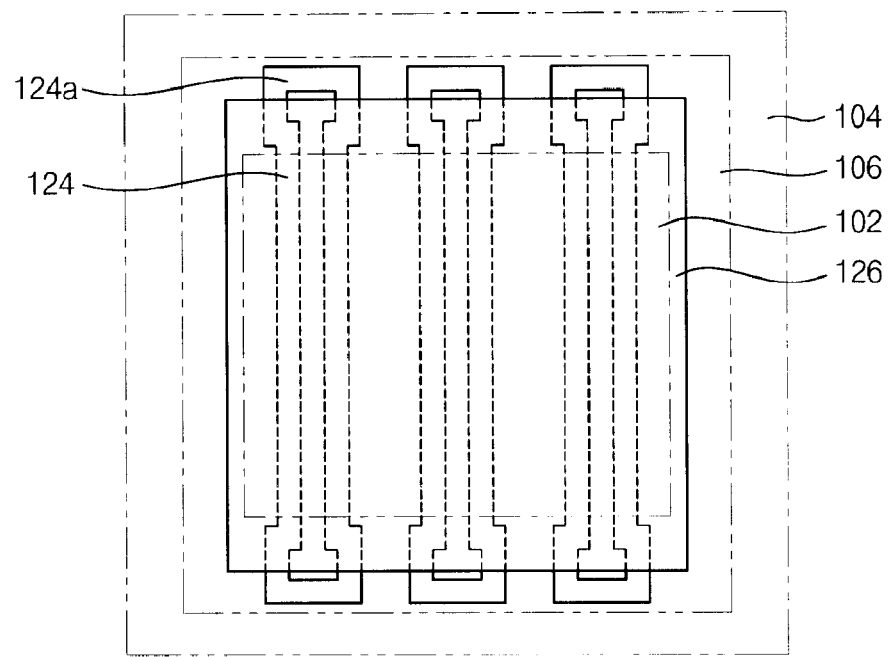
Figure 6:
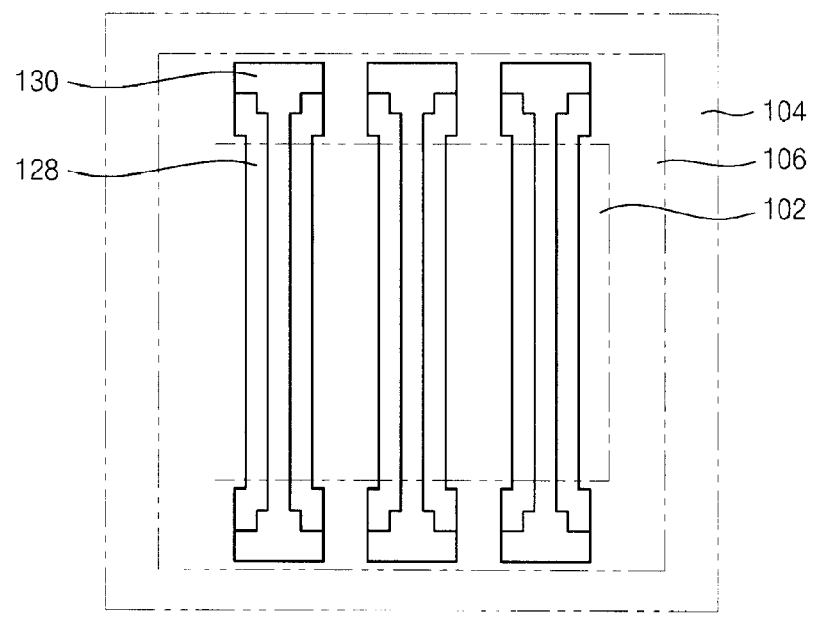

Next, a photoresist is formed on the structure depicted in FIGS. 4a-4c. The photoresist is selectively exposed/patterned to obtain photoresist (PR) layer 126, which leaves end portions 124a of mask layer portions 124 exposed, as depicted in FIG. 5. Using PR layer 126, end portions 124a of mask layer portions 124 are selectively removed. Then PR layer 126 is removed, e.g., using an ashing strip process. With end portions 124a of mask layer portions 124 having been removed, smaller portions 128 of mask layer portions 124 remain, as depicted in FIG. 6. Portions 130 of sacrificial layer 114 are now exposed.

Figure 7A:
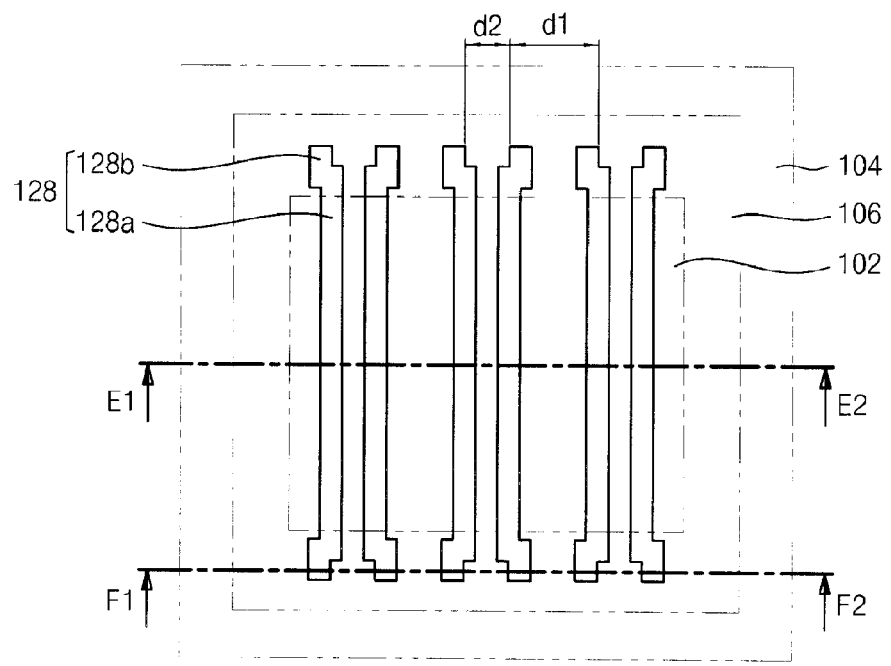
Figure 7B:
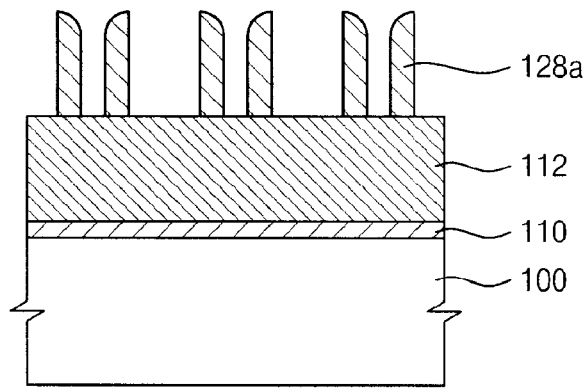
Figure 7C:
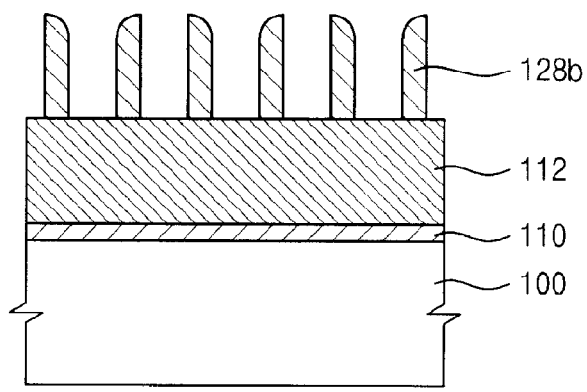

FIGS. 7a-7c depict an intermediate stage, subsequent to that of FIG. 6, in which the remaining portions of sacrificial layer 114 have been removed (e.g., isotropically etched, e.g., uses a chemical dry etch ("CDE") technique), which leaves behind mask portions 128a in inner region 102 and mask portions 128b in intermediate region 106. FIG. 7b is a cross-section of the intermediate stage of FIG. 7a taken along the line E1:E2 so as to depict inner region 102. FIG. 7c is a cross-section of the intermediate stage of FIG. 7a taken along the line F1:F2 so as to depict intermediate area 106.

An inter-pair spacing (or, in other words, pitch) in inner region 102 is denoted as d1. An intra-pair spacing (or, again, pitch) in inner region 102 is denoted as d2. Typically, d2<d1.

Figure 8A:
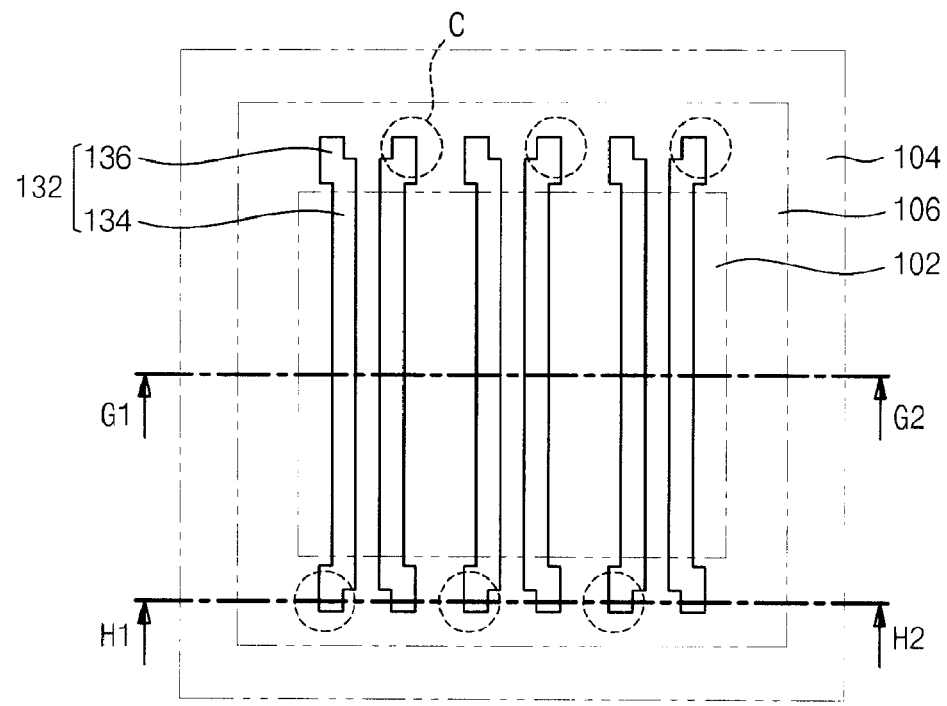
Figure 8B:
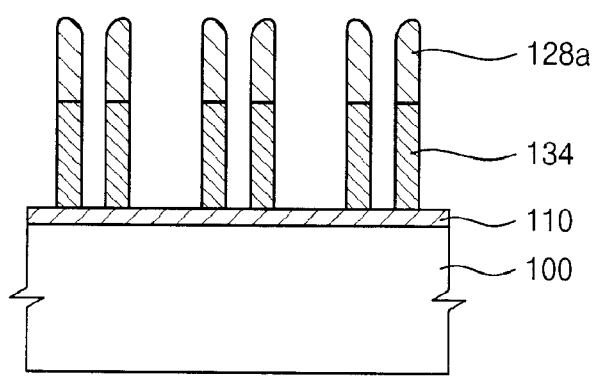
Figure 8C:
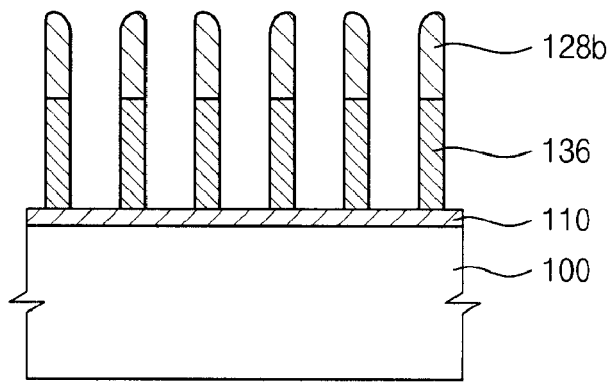

FIGS. 8a-8c depict an intermediate stage, subsequent to that of FIGS. 7a-7c, in which the portions of conductive layer 112 have been etched using mask portions 128a and 128b resulting in line portions 134 in inner region 102 and 136 in intermediate region 106, respectively. FIG. 8b is a cross-section of the intermediate stage of FIG. 8a taken along the line G1:G2 so as to depict inner region 102. FIG. 8c is a cross-section of the intermediate stage of FIG. 8a taken along the line H1:H2 so as to depict intermediate area 106. Subsequently, mask portions 128b and 128b can be removed.

Now, a discussion is provided of another example method (according to an example embodiment of the present invention) for manufacturing an interconnection architecture of a semiconductor device, e.g., such as the interconnection architecture 1900A of FIG. 19A. The example method will be illustrated via reference to FIGS. 9-17b. In particular, FIGS. 9, 10b-10c, 11b-11c, 14b-14c, 15b-15c, 16a-16b and 17a-17b are cross-sectional views and FIGS. 10a, 11a, 12-13, 14a and 15a are top views of intermediary various stages in the example method.

Figure 9:
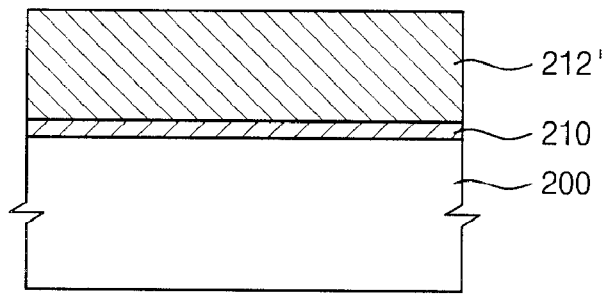
FIGS. 9, 10b-10c, 11b-11c, 14b-14c, 15b-15c, 16a-16b and 17a-17b are cross-sectional views
Figure 10A:
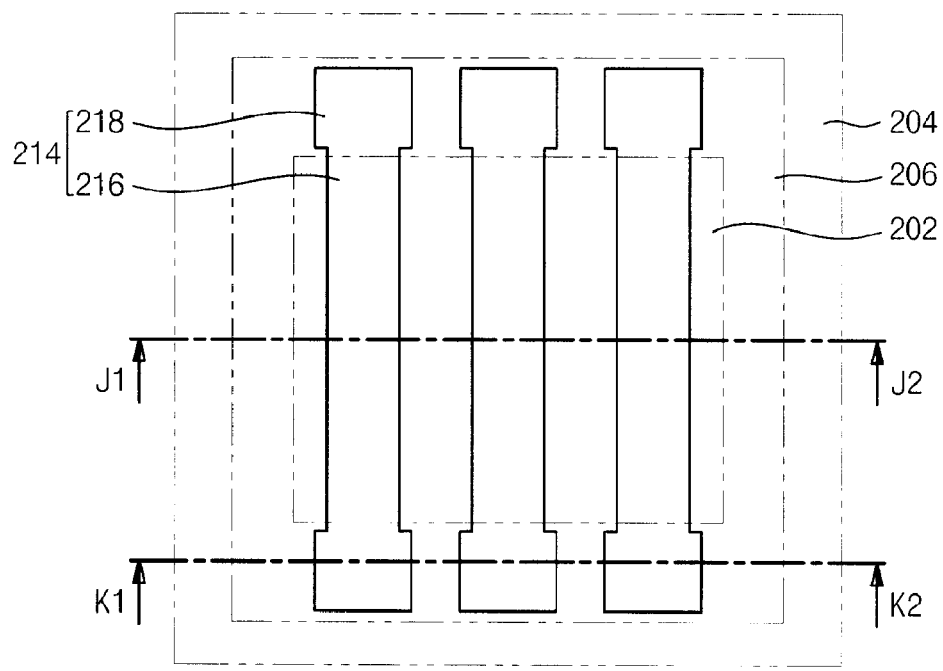
FIGS. 10a, 11a, 12-13, 14a and 15a are top views of various intermediary stages in a method (according to an example embodiment of the present invention) for manufacturing an interconnection architecture of a semiconductor device.
Figure 10B:
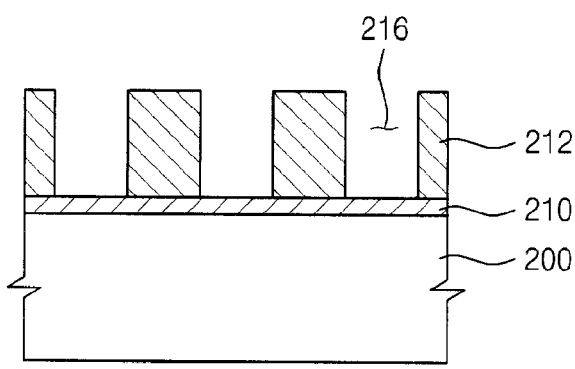
Figure 10C:
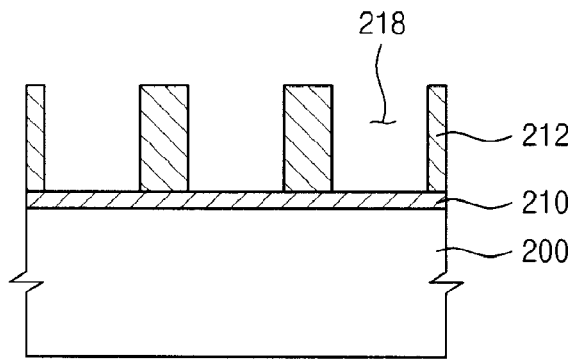

In FIG. 9, a substrate 200 (e.g., single crystal silicon) is provided, on which are formed an insulating layer 210 (e.g., a dielectric such as an oxide of silicon, e.g., formed using chemical vapor deposition ("CVD" or thermal oxidation), and thereon a first mold layer 212' (e.g., a dielectric such as an oxide of silicon or silicon nitride). FIGS. 10a-10c depict an intermediate stage in which mold layer 114 has been patterned and partially removed.

In FIG. 10a, for continuity vis-à-vis, e.g., FIG. 19, an inner region 202, an intermediate region 206 and an outer region 204 have been depicted. Openings 214 have been formed in mold layer 214. Each opening 214 can be described as having a shape similar to the uppercase letter "I" and also can be described as including body opening 216, and head & foot openings 218. Opening 218, which can be described as having a width $L_{IR}$, is wider than opening 216, which can be described as having a width $L_C$.

FIG. 10b is a cross-section of the intermediate stage of FIG. 10a taken along the line J1:J2 so as to depict inner region 202. FIG. 10c is a cross-section of the intermediate stage of FIG. 2a taken along the line K1:K2 so as to depict intermediate area 206. Opening 218 is wider than opening 216.

Figure 11A:
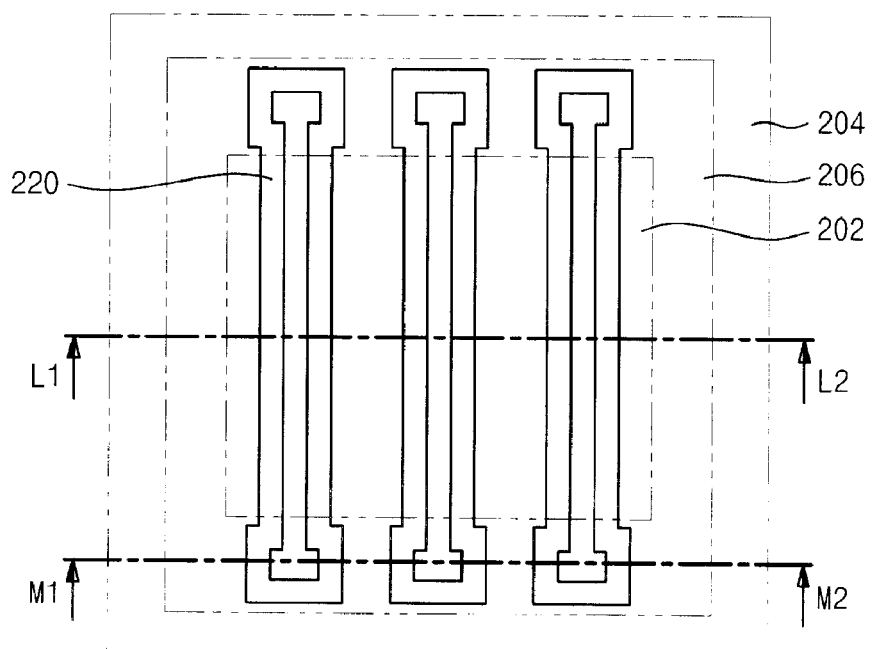
Figure 11B:
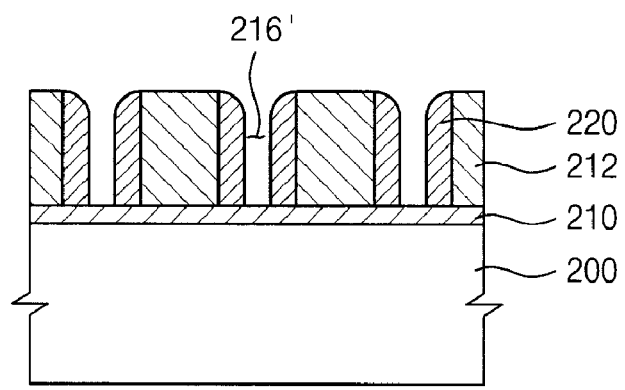

FIGS. 11a-11b depict an intermediate stage formed subsequently to that of FIGS. 10b-10c. In FIGS. 11a-11b, a mask layer (not shown) (e.g., a dielectric such as an oxide of silicon, e.g., formed using chemical vapor deposition ("CVD") or thermal oxidation) has been formed on the remaining portions 212 of mold layer 212', and on portions of insulating layer 210 exposed by openings 216 and 218. The material for mask layer can be a dielectric, e.g., having a high etch selectively relative to mold layer 214. For example, if mold layer 212' is an oxide, then the mask layer can be silicon nitride. The mask layer is selectively removed (e.g., via anisotropic etching), resulting in openings 216' and 218' to expose portions of insulating layer 210 and top surfaces of mold layer portions 212. Remaining portions of the mask layer remain as spacers 220 abutting sidewalls of the remaining mold layer 212 portions.

Figure 11C:
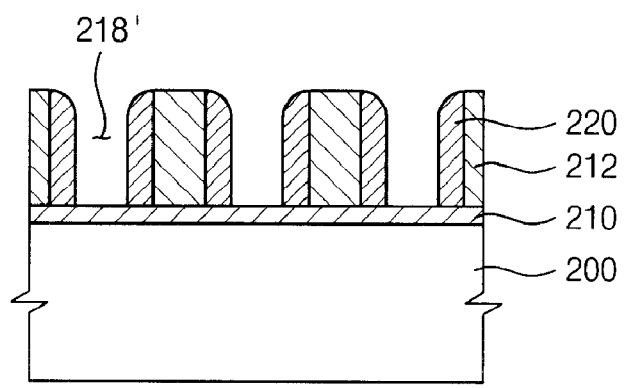
Figure 12:
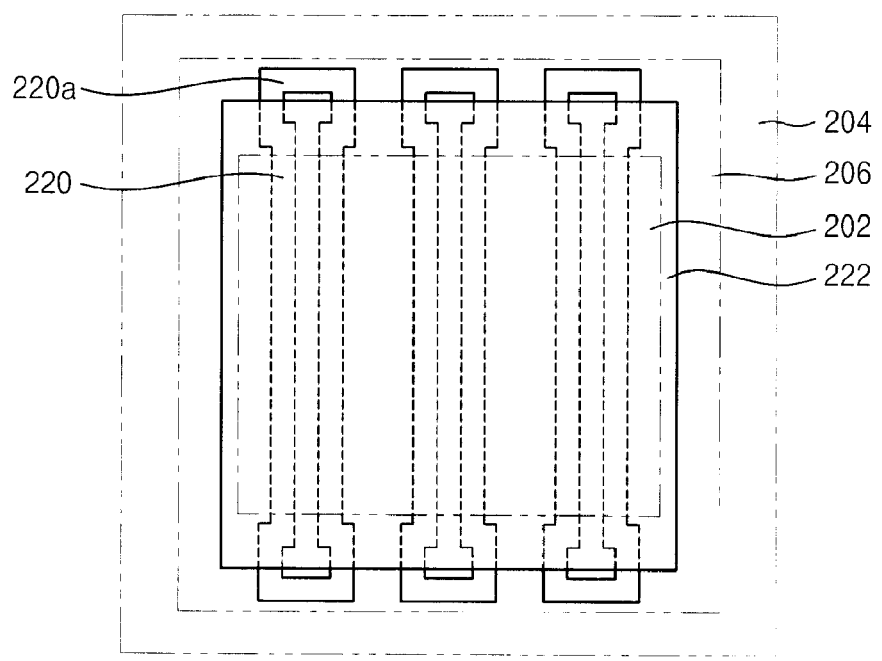
Figure 13:
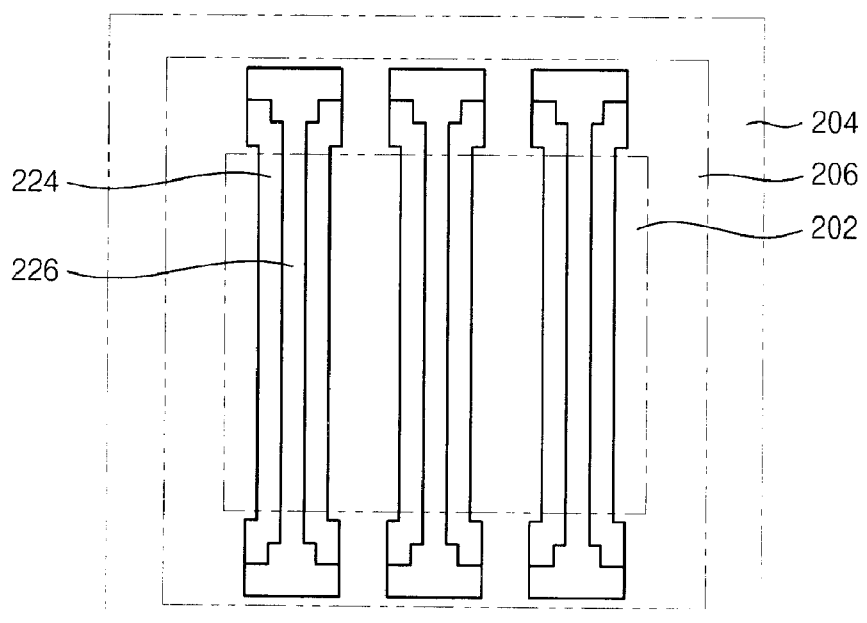

Next, a photoresist is formed on the structure depicted in FIGS. 11a-11c. The photoresist is selectively exposed/patterned to obtain photoresist (PR) layer (not show), which leaves end portions 220a of the mask layer exposed, as depicted in FIG. 12. Using the patterned photoresist layer, end portions 220a of the mask layer are selectively removed, e.g., via etching. Then, as depicted in FIG. 13, the mask layer is removed, e.g., using an ashing strip process. As a result, opening 226 (corresponding to opening 216) is formed, with a pair of spacers 224 that remain in opening 226. Again, portions 130 of insulating 210 have become exposed.

Figure 14A:
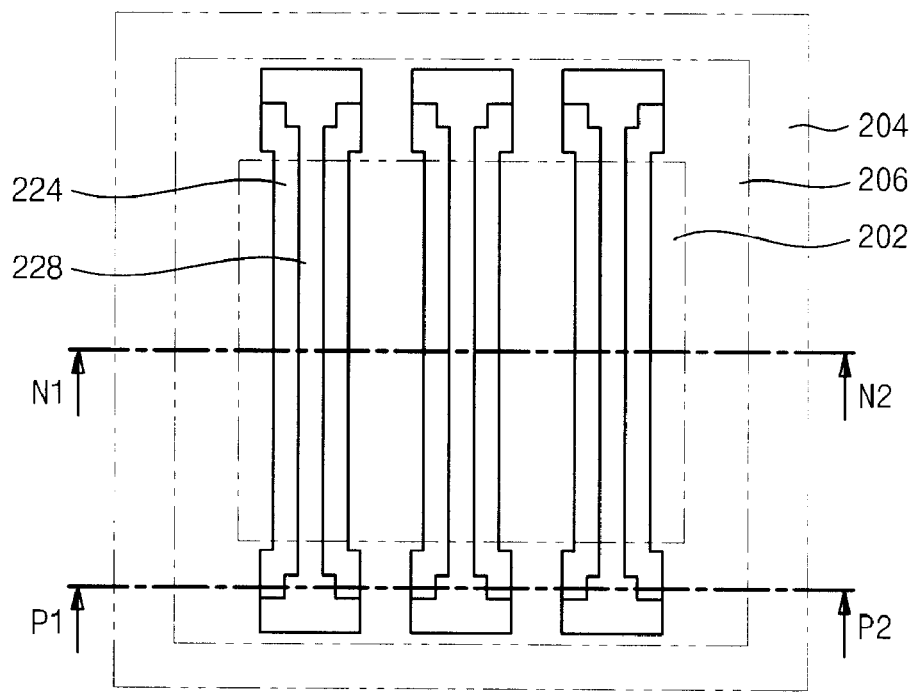
Figure 14B:
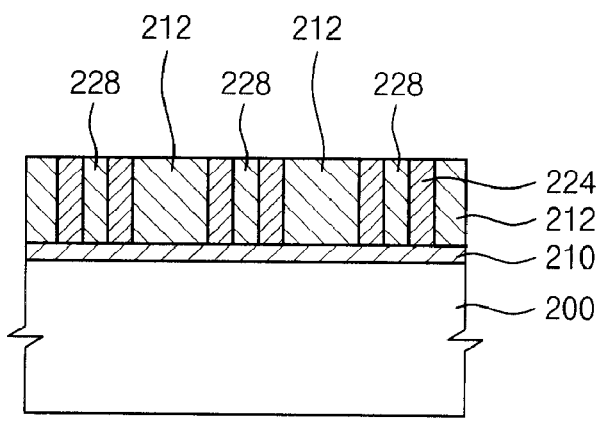
Figure 14C:
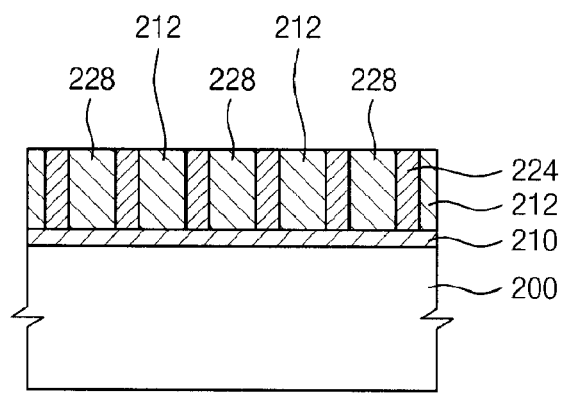

FIGS. 14a-14c depict an intermediate stage, subsequent to that of FIG. 13, in which a second mold layer (not depicted, e.g., including the same material as first mold layer 212') has been formed on the intermediate structure of FIG. 13 and then partially removed (e.g., using anisotropic dry etching, and/or chemical-mechanical polishing ("CMP"), etc.). FIG. 14b is a cross-section of the intermediate stage of FIG. 14a taken along the line N1:N2 so as to depict inner region 102. FIG. 14c is a cross-section of the intermediate stage of FIG. 7a taken along the line P1:P2 so as to depict intermediate area 106.

In FIGS. 14b and 14c, the partial removal of the second mold layer results in a planar surface formed by exposed upper surfaces of spacers 224, remaining portions 228 of the second mold layer and remaining first mold layer portions 212. Next, spacers 224 are removed (e.g., via anisotropic dry etching), as depicted in FIGS. 15a-15c.

Figure 15A:
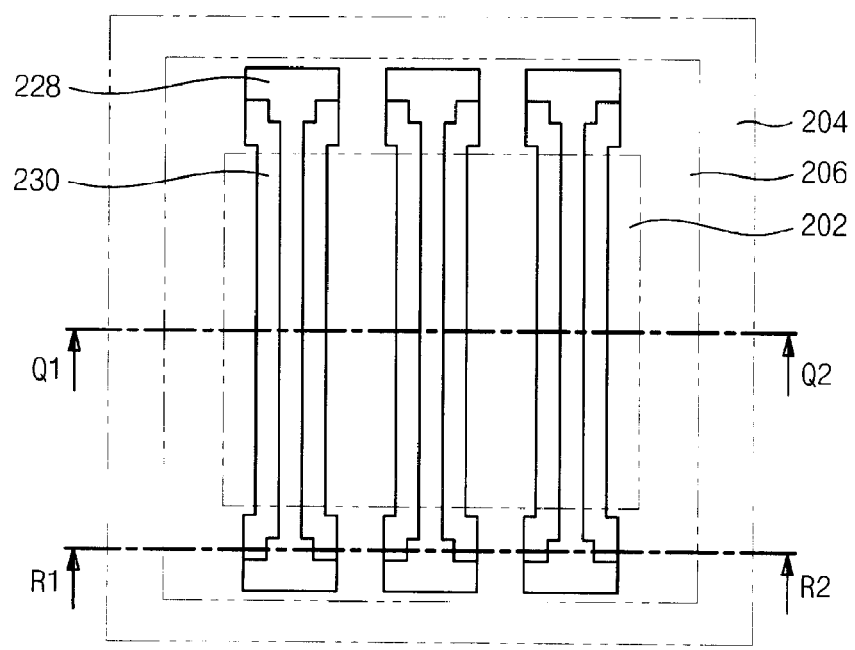
Figure 15B:
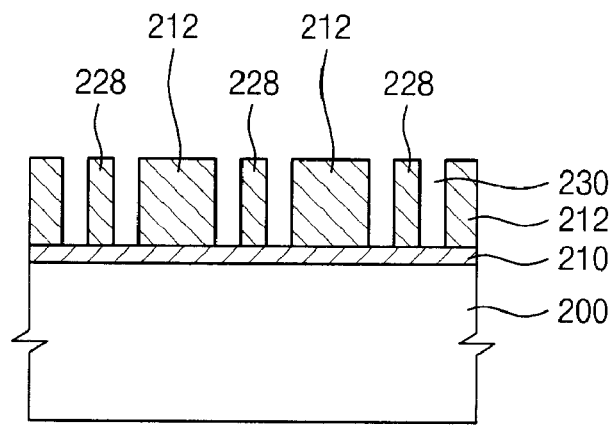

FIGS. 15a-15b depict an intermediate stage, subsequent to that of FIGS. 14a-14c. In FIG. 15a, the removal of spacers 224 is depicted as having resulted in openings 230 are formed amongst remaining second mold layer portions 228 and first mold layer portions 212, which expose portions of insulating layer 210. FIG. 15b is a cross-section of the intermediate stage of FIG. 15a taken along the line Q1:Q2 so as to depict inner region 202. FIG. 15c is a cross-section of the intermediate stage of FIG. 15a taken along the line R1:R2 so as to depict intermediate area 206.

Figure 15C:
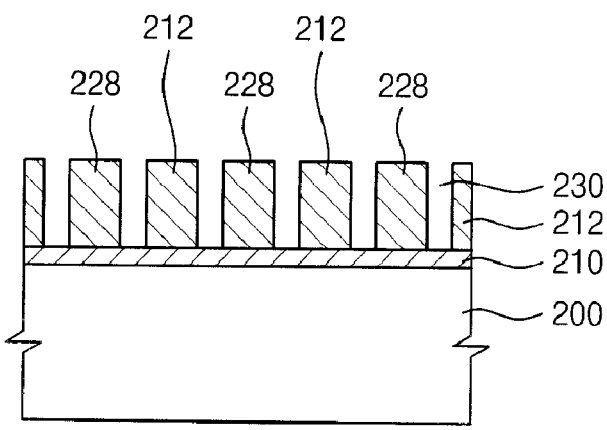
Figure 16A:
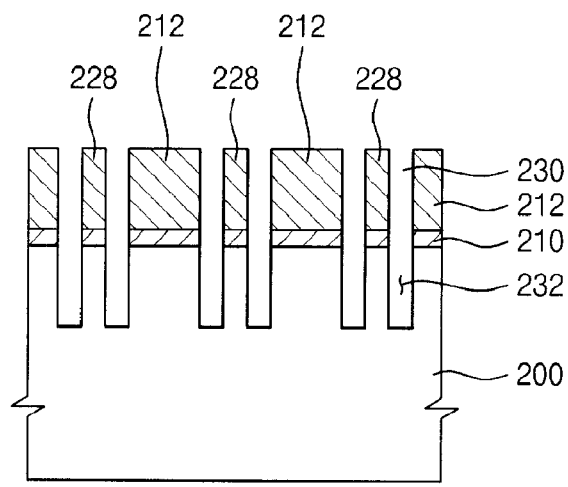
Figure 16B:
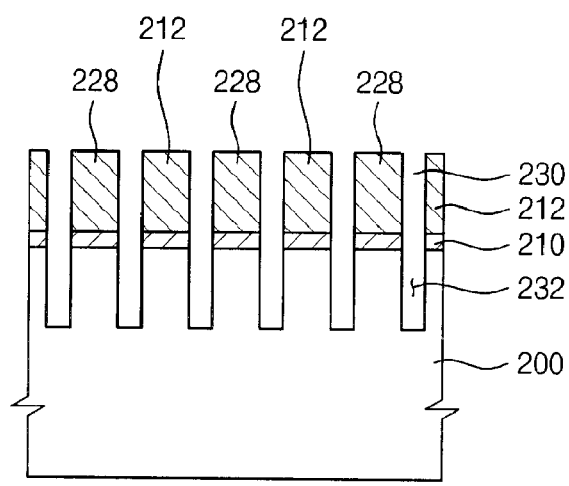

FIGS. 16a-16b depict an intermediate stage, subsequent to that of FIGS. 15a-15c. FIG. 16a is a cross-section corresponding to a line taken along the line Q1:Q2 of FIG. 15b so as to depict inner region 202. FIG. 16b is a cross-section corresponding to a line taken along the line R1:R2 of FIG. 15b so as to depict intermediate area 206. In FIGS. 16a-16b, trenches 232 have been formed in substrate 200, e.g., by etching insulating layer 210 and substrate 200 using remaining second mold layer portions 228 and first mold layer portions 212 as an etching mask.

Figure 17A:
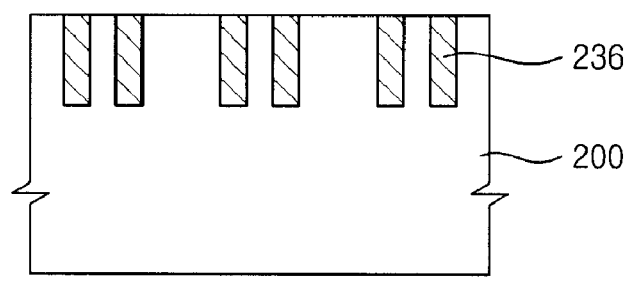
Figure 17B:
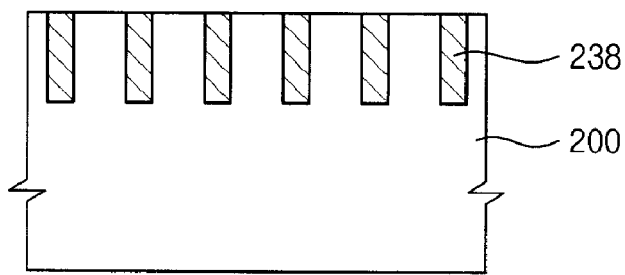

FIGS. 17a-17b depict an intermediate stage, subsequent to that of FIGS. 16a-16b, in which a conductive layer has been formed on the intermediate structure of FIGS. 16a-16b and then partially removed. FIG. 17a is a cross-section corresponding to a line taken along the line Q1:Q2 of FIG. 15b so as to depict inner region 202. FIG. 17b is a cross-section corresponding to a line taken along the line R1:R2 of FIG. 15b so as to depict intermediate area 206. As reflected in FIGS. 17a-17b, after the conductive layer is formed, portions of it as well as remaining second mold layer portions 228, remaining first mold layer portions 212 and remaining insulating layer portions 210 are removed (e.g., using anisotropic dry etching, etc.). FIGS. 17a-17b can be described as depicting a buried signal line type of architecture.

With some embodiments of the present invention having thus been described, it will be obvious that the same may be varied in many ways. Such variations are not to be regarded as a departure from the spirit and scope of the present invention, and all such modifications are intended to be included within the scope of the present invention.

The invention claimed is:

1. A method of forming a semiconductor memory device, comprising:

providing a substrate including an inner region with a plurality of memory cells, an intermediate region located aside the inner region, and an outer region on a side of the intermediate region opposite to the inner region;

forming an insulating layer, a conductive layer and a sacrificial layer sequentially on the substrate patterning the sacrificial layer to form a sacrificial pattern including at least one rectangular opening across the inner region and the intermediate region through which the conductive layer is partially exposed, the rectangular opening including a first opening in the inner region and a second opening in the intermediate region, a size of the second opening greater than a size of the first opening;

forming at least a pair of spacer lines on a sidewall of the sacrificial pattern along the rectangular opening, a first gap distance of the pair of the spacer lines in the inner region less than a second gap distance of the pair of spacer lines in the intermediate region;

removing the sacrificial pattern; and patterning the conductive layer using the spacer lines as an etch mask to form a plurality of conductive lines extending across the inner region and the intermediate region, a pair of the conductive lines being spaced apart by the first gap distance in the inner region and by the second gap distance in the intermediate region.

2. The method of claim 1, wherein the forming at least a pair of spacer lines includes:

forming a mask layer on the sacrificial pattern, and conformal to the sidewall of the sacrificial pattern and the conductive layer partially exposed in the rectangular opening; and removing the mask layer such that a residual of the mask layer remains on the sidewall of the sacrificial pattern in the rectangular opening across the inner region and the intermediate region, thereby forming a line-shaped spacer on the sidewall of the sacrificial pattern.

3. The method of claim 2, after the forming of the line-shaped spacer, further comprising:

forming a blocking layer to cover the inner region and a lower portion of the intermediate region that is continuous with the inner region, so that the spacer lines in the inner region and the lower portion of the intermediate region are covered with the blocking layer, and the spacer lines in an upper portion of the intermediate region are not covered by the blocking layer; and removing the spacer lines from the upper portion of the intermediate region using the blocking layer as an etch mask so that the spacer lines remain in the inner region and the lower portion of the intermediate region.

* * * * *